United States Patent
Kozaka et al.

(10) Patent No.: US 7,629,687 B2
(45) Date of Patent: Dec. 8, 2009

(54) SEMICONDUCTOR DEVICE AND METHOD FOR MANUFACTURING THE SAME

(75) Inventors: Yukihiro Kozaka, Kyoto (JP); Toshiyuki Fukuda, Kyoto (JP); Nozomi Shimoishizaka, Kyoto (JP); Kazuhiko Matsumura, Nara (JP)

(73) Assignee: Panasonic Corporation, Osaka (JP)

( * ) Notice: Subject to any disclaimer, the term of this patent is extended or adjusted under 35 U.S.C. 154(b) by 445 days.

(21) Appl. No.: 11/553,766

(22) Filed: Oct. 27, 2006

(65) Prior Publication Data
US 2007/0108627 A1 May 17, 2007

(30) Foreign Application Priority Data
Nov. 15, 2005 (JP) ............... 2005-330743

(51) Int. Cl.
*H01L 23/488* (2006.01)
(52) U.S. Cl. .............. 257/737; 257/772; 257/781; 257/E21.508; 257/E23.021
(58) Field of Classification Search ........... 257/772, 257/781, E23.033
See application file for complete search history.

(56) References Cited

U.S. PATENT DOCUMENTS

| | | | | |
|---|---|---|---|---|
| 5,427,301 A | * | 6/1995 | Pham et al. | 228/110.1 |
| 5,477,087 A | * | 12/1995 | Kawakita et al. | 257/737 |
| 5,616,520 A | * | 4/1997 | Nishiuma et al. | 438/125 |
| 5,655,700 A | * | 8/1997 | Pham et al. | 228/106 |
| 5,828,128 A | * | 10/1998 | Higashiguchi et al. | 257/738 |
| 6,137,184 A | * | 10/2000 | Ikegami | 257/785 |
| 6,232,668 B1 | * | 5/2001 | Hikita et al. | 257/777 |
| 6,269,999 B1 | * | 8/2001 | Okazaki et al. | 228/110.1 |
| 6,399,419 B1 | * | 6/2002 | Shibata et al. | 438/108 |
| 6,461,890 B1 | * | 10/2002 | Shibata | 438/106 |

(Continued)

FOREIGN PATENT DOCUMENTS

JP 2004-327936 11/2004

(Continued)

*Primary Examiner*—David Vu
*Assistant Examiner*—Earl N Taylor
(74) *Attorney, Agent, or Firm*—Hamre, Schumann, Mueller & Larson, P.C.

(57) ABSTRACT

A semiconductor device includes a wiring board having a plurality of conductive wires aligned on an insulating base material and a board bump with a plated metal formed on each conductive wire so as to cover an upper surface and both sides of the conductive wire; and a semiconductor chip mounted on the wiring board, with electrodes of the semiconductor chip being connected to the conductive wires via the board bumps. Chip bumps are formed on the electrodes of the semiconductor chip. The electrodes of the semiconductor chip are connected to the conductive wires via a bond between the chip bumps and the board bumps. Protruding portions are formed by part of the plated metal of the board bumps at the bonded portion peeling off and protruding outwardly from a bonding surface of the chip bumps and the board bumps. Mechanical damage to the semiconductor chip caused by ultrasonic vibrations applied during process of mounting the semiconductor chip.

3 Claims, 9 Drawing Sheets

OTHER PUBLICATIONS

Takahashi et al., Ultra-high-density interconnection technology of three-dimensional packaging, Microelectronics Reliability, 2003, pp. 1267-1279.*

U.S. PATENT DOCUMENTS

| | | | |
|---|---|---|---|
| 6,565,687 B2 * | 5/2003 | Gotoh et al. | 156/64 |
| 6,635,962 B2 * | 10/2003 | Shibata et al. | 257/737 |
| 6,821,813 B2 * | 11/2004 | Su | 438/106 |
| 6,838,316 B2 * | 1/2005 | Iizuka et al. | 438/107 |
| 6,933,615 B2 * | 8/2005 | Maeda | 257/780 |
| 7,115,446 B2 * | 10/2006 | Koo et al. | 438/125 |
| 7,264,146 B2 * | 9/2007 | Takeuchi et al. | 228/1.1 |
| 7,285,734 B2 * | 10/2007 | Imamura et al. | 174/534 |
| 7,288,729 B2 * | 10/2007 | Imamura et al. | 174/534 |
| 7,294,532 B2 * | 11/2007 | Imamura et al. | 438/108 |
| 7,307,349 B2 * | 12/2007 | Hikita et al. | 257/778 |
| 7,382,050 B2 * | 6/2008 | Matsumura et al. | 257/737 |
| 7,429,796 B2 * | 9/2008 | Abe et al. | 257/737 |
| 2002/0031904 A1 * | 3/2002 | Shibata et al. | 438/615 |
| 2002/0070459 A1 * | 6/2002 | Iwasaki et al. | 257/778 |
| 2002/0127773 A1 * | 9/2002 | Shibata et al. | 438/108 |
| 2002/0145362 A1 * | 10/2002 | Taga | 310/313 R |
| 2002/0149118 A1 * | 10/2002 | Yamaguchi et al. | 257/778 |
| 2004/0178486 A1 * | 9/2004 | Maeda | 257/678 |
| 2004/0212969 A1 * | 10/2004 | Imamura et al. | 361/760 |
| 2004/0217474 A1 * | 11/2004 | Kajiwara et al. | 257/734 |
| 2004/0229425 A1 * | 11/2004 | Yamaguchi et al. | 438/232 |
| 2005/0110163 A1 * | 5/2005 | Koo et al. | 257/778 |
| 2005/0218485 A1 * | 10/2005 | Imamura et al. | 257/668 |
| 2005/0218496 A1 * | 10/2005 | Imamura et al. | 257/678 |
| 2006/0237841 A1 * | 10/2006 | Matsumura et al. | 257/737 |
| 2007/0108627 A1 * | 5/2007 | Kozaka et al. | 257/778 |
| 2007/0222085 A1 * | 9/2007 | Abe et al. | 257/778 |
| 2008/0164608 A1 * | 7/2008 | Matsumura et al. | 257/737 |
| 2008/0173477 A1 * | 7/2008 | Imamura et al. | 174/534 |

OTHER PUBLICATIONS

Bonkohara et al., Trends and Opportunities of System-in-a-Package and Three-Dimensional Integration, Electronics and Communications in Japan, Part 2, vol. 88, No. 10, 2005, pp. 37-49.*

Kim et al., Soldering Method Using Longitudinal Ultrasonic, IEEE Transactions on Components and Packaging Technologies, vol. 28, No. 3, 2005, pp. 493-498.*

Lee et al., Thermosonic Bonding of Lead-Free Solder with Metal Bump for Flip-Chip Bonding, Journal of Electronic Materials, vol. 34, No. 1, 2005, pp. 96-102.*

Maruo et al., Ultrasonic Flip Chip Bonding, Electronic Circuit World Conference, par of APEX/IPC Printed Circuits Expo, 2005, pp. 1-3.*

Tanida et al., Au Bump Interconnection with Ultrasonice Flip-Chip Bonding in 20 um Pitch, Japan Journal of Applied Physics, vol. 42, 2003, pp. 2198-2203.*

Tatsumi et al., An Application of Micro-ball Wafer Bumping to Double Ball Bump for Flip Chip Interconnection, IEEE Electronic Components and Technology Conference, 2005, pp. 855-860.*

Watanabe et al., Behavior of Plated Microbumps during Ultrasonice Flip-Chip Bonding Determined from Dynamic Strain Measurement, Japan Journal of Applied Physics, vol. 42, 2003, pp. 2193-2197.*

* cited by examiner

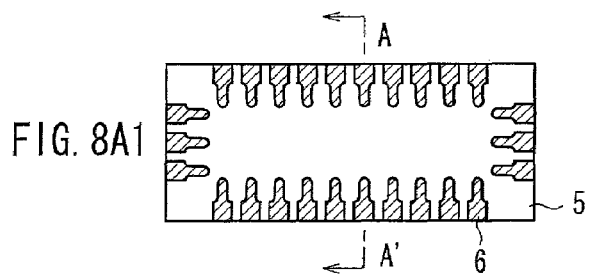
FIG. 8A1
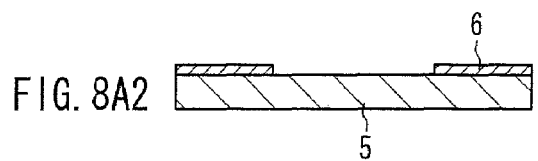
FIG. 8A2
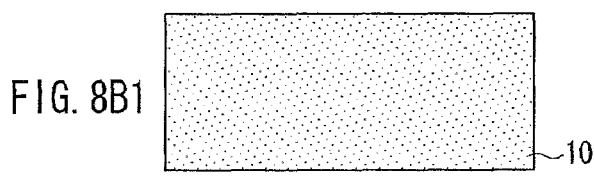
FIG. 8B1
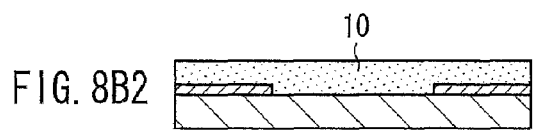
FIG. 8B2
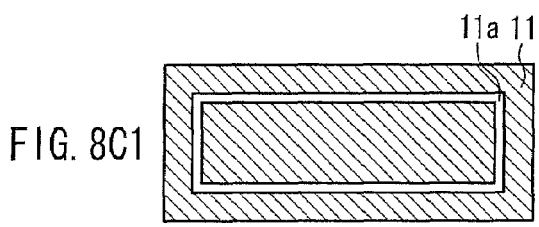
FIG. 8C1
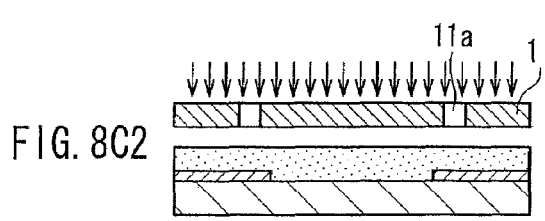
FIG. 8C2
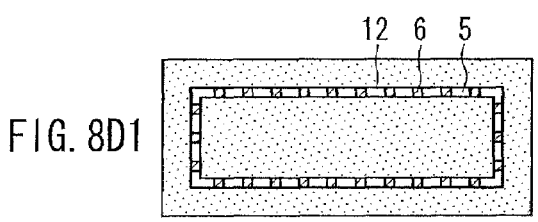
FIG. 8D1
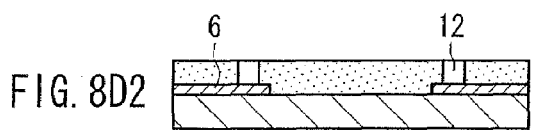
FIG. 8D2
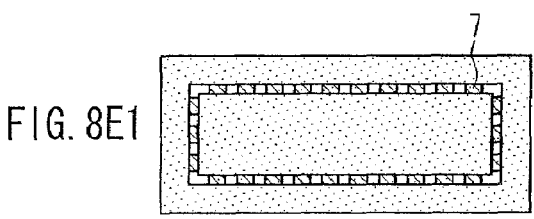
FIG. 8E1
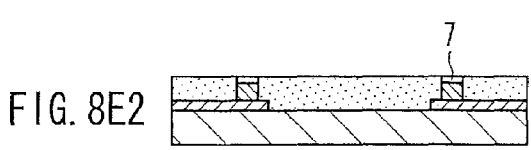
FIG. 8E2
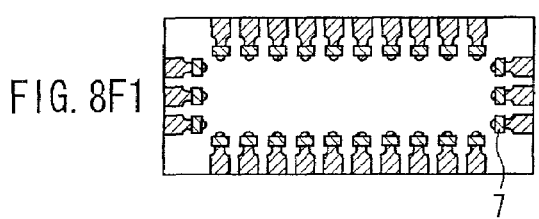
FIG. 8F1
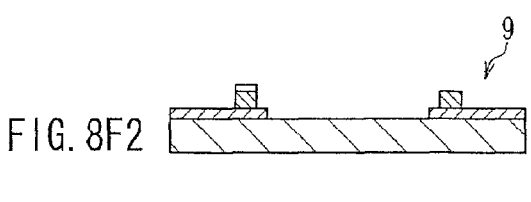
FIG. 8F2

SEMICONDUCTOR DEVICE AND METHOD FOR MANUFACTURING THE SAME

BACKGROUND OF THE INVENTION

1. Field of the Invention

The present invention relates to a semiconductor device in which electrodes on a semiconductor chip are connected electrically to conductive wires on a wiring board via protruding electrodes (bumps), and to a method for manufacturing the same.

2. Description of the Related Art

A package such as a Bump on Film (BOF) used in LCD drivers and the like is known as a semiconductor device in which protruding electrodes (bumps) are formed on conductive wires on a wiring board and electrodes on a semiconductor chip are connected electrically to the conductive wires via the bumps. Tape carrier substrates in which wiring is formed on a film base material such as polyimide often are used as wiring boards for mounting semiconductor chips.

A semiconductor device disclosed in JP 2004-327936A is described below with reference to the drawings, as an example of a conventional semiconductor device in which electrodes on a semiconductor chip are electrically connected to conductive wires on a film base material via bumps.

FIG. 11 is a cross-sectional view showing a semiconductor device as an exemplary configuration of a conventional BOF. This semiconductor device, in which a semiconductor chip 1 is mounted on a tape carrier substrate 9 and the connection between the circuit side of the semiconductor chip 1 and the tape carrier substrate 9 is protected by a sealing resin 8, is used primarily as a driver for driving flat panel displays such as LCD displays.

The tape carrier substrate 9 has as its main elements a flexible insulating film base material 5, conductive wires 6 formed on a surface of the film base material 5, and bumps 14 provided on the conductive wires 6. The bumps 14 are formed on those conductive wires 6 on the film base material 5 that are disposed in positions opposed to electrodes 2 on the semiconductor chip 1. A metal plating film and a solder mask layer of insulating resin are formed on the conductive wires 6 as needed. Typically, polyimide is used as the film base material 5, and copper is used as the conductive wires 6.

To electrically connect the conductive wires 6 on the film base material 5 to the electrodes 2 on the semiconductor chip 1 via the bumps 14, the bumps 14 formed on the conductive wires 6 of the film base material 5 are bonded to the electrodes 2 of the semiconductor chip 1 by applying ultrasonic vibrations, for example, through the upper surface of the semiconductor chip.

With the above connection method in a conventional BOF, mechanical damage such as cracking is apt to be caused beneath the electrodes of the semiconductor chip, because the bumps formed on the conductive wires of the film base material are bonded directly to the electrodes of the semiconductor chip by applying ultrasonic vibrations to the semiconductor chip, as described above.

SUMMARY OF THE INVENTION

An object of the present invention, which solves the above conventional problem, is to provide a semiconductor device having a configuration that is capable of reducing effectively mechanical damage beneath the electrodes of a semiconductor chip caused by ultrasonic vibrations for electrically connecting the electrodes of the semiconductor chip to conductive wires on a film base material via bumps. A further object of the present invention is to provide a method for manufacturing such a semiconductor device.

A semiconductor device of the present invention includes a wiring board having a plurality of conductive wires aligned on an insulating base material and a board bump with a plated metal formed on each conductive wire so as to cover an upper surface and both sides of the conductive wire; and a semiconductor chip mounted on the wiring board, with electrodes of the semiconductor chip being connected to the conductive wires via the board bumps. To solve the above problem, chip bumps are formed on the electrodes of the semiconductor chip, the electrodes of the semiconductor chip are connected to the conductive wires via a bond between the chip bumps and the board bumps, and protruding portions are formed by part of the plated metal of the board bumps at the bonded portion peeling off and protruding outwardly from a bonding surface of the chip bumps and the board bumps.

A method for manufacturing a semiconductor device of the present invention includes: placing a semiconductor chip on a wiring board having a plurality of conductive wires aligned on an insulating base material and a board bump with plated metal formed on each conductive wire so as to cover an upper surface and both sides of the conductive wire; and connecting electrodes of the semiconductor chip to the conductive wires via the board bumps, thereby mounting the semiconductor chip on the wiring board. To solve the above problem, chip bumps are formed on the electrodes of the semiconductor chip, and the chip bumps and the board bumps are bonded to each other so that part of surface plating of the board bumps at a bonding surface with the chip bumps peels off during the bonding and protrudes on a periphery of the bonding surface.

BRIEF DESCRIPTION OF THE DRAWINGS

FIGS. 8A1 to 8F1 are plan views showing processes for manufacturing a tape carrier substrate with bumps used in a method for manufacturing a semiconductor device according to Embodiment 2 of the present invention.

FIGS. 8A2 to 8F2 are cross-sectional views corresponding to FIGS. 8A1 to 8F1.

DETAILED DESCRIPTION OF THE INVENTION

A semiconductor device of the present invention includes a wiring board having a plurality of conductive wires aligned on an insulating base material and a board bump with plated metal formed on each conductive wire so as to cover an upper surface and both sides of the conductive wire. A semiconductor chip is mounted on the wiring board, with electrodes of the semiconductor chip being connected to the conductive wires via the board bumps. Here, chip bumps are formed on the electrodes of the semiconductor chip, and the electrodes of the semiconductor chip are connected to the conductive wires via a bond between the chip bumps and the board bumps. Also, protruding portions are formed by part of the plating of the board bumps at the bonded portions peeling off and protruding outwardly from a bonding surface of the chip bumps and the board bumps.

According to the above configuration, the vertex plating of the board bumps peels off to form protruding portions that are positioned on a periphery of the bonding portion between the board bumps and the chip bumps, with stable connection reliability being obtained by part of these protruding portions bonding with the chip bumps.

Thus, even in the case where ultrasonic vibrations are used when bonding the board bumps and chip bumps, it is possible to form a strong connection between the board bumps and the chip bumps while reducing mechanical damage beneath the electrodes of the semiconductor chip caused by the ultrasonic vibrations, and thereby improve device reliability.

In a semiconductor device of the present invention having the above configuration, a flat area of the chip bumps preferably is larger than an area of the bond with the board bumps, and the board bumps preferably have a lower hardness than the chip bumps.

Also, part of the plating of the board bumps that protrudes outwardly from the bonding surface preferably is alloyed with the plating of the chip bumps.

Further, the thickness of plating of the board bumps at the bonding surface preferably is from ⅓ to ⅛ of the thickness of the plating in portions other than the bonding surface.

In a method for manufacturing a semiconductor device of the present invention having the above configuration, a material having a lower hardness than the chip bumps preferably is used for the board bumps, and when bonding the chip bumps and the board bumps, the vertex of the board bumps preferably is flattened, without deforming the chip bumps.

The bonding preferably is performed so that the plating of the board bumps at the bonding surface becomes thinner than the plating in portions other than the bonding surface during bonding of the chip bumps and the board bumps.

A semiconductor device showing an embodiment of the present invention, and a method for manufacturing the same are described in detail below with reference to the drawings.

EMBODIMENT 1

Figure 1:
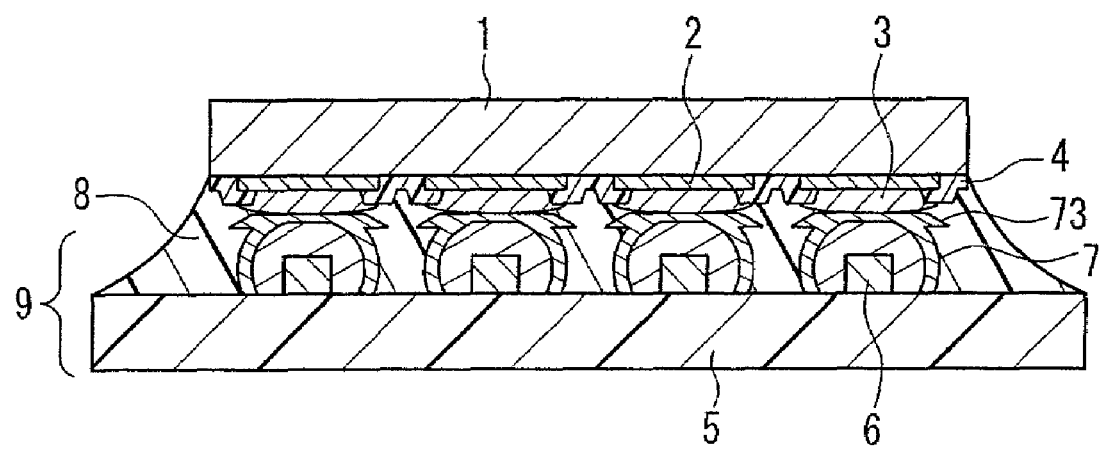
FIG. 1 is a cross-sectional view showing a semiconductor device according to Embodiment 1 of the present invention.
Figure 2A:
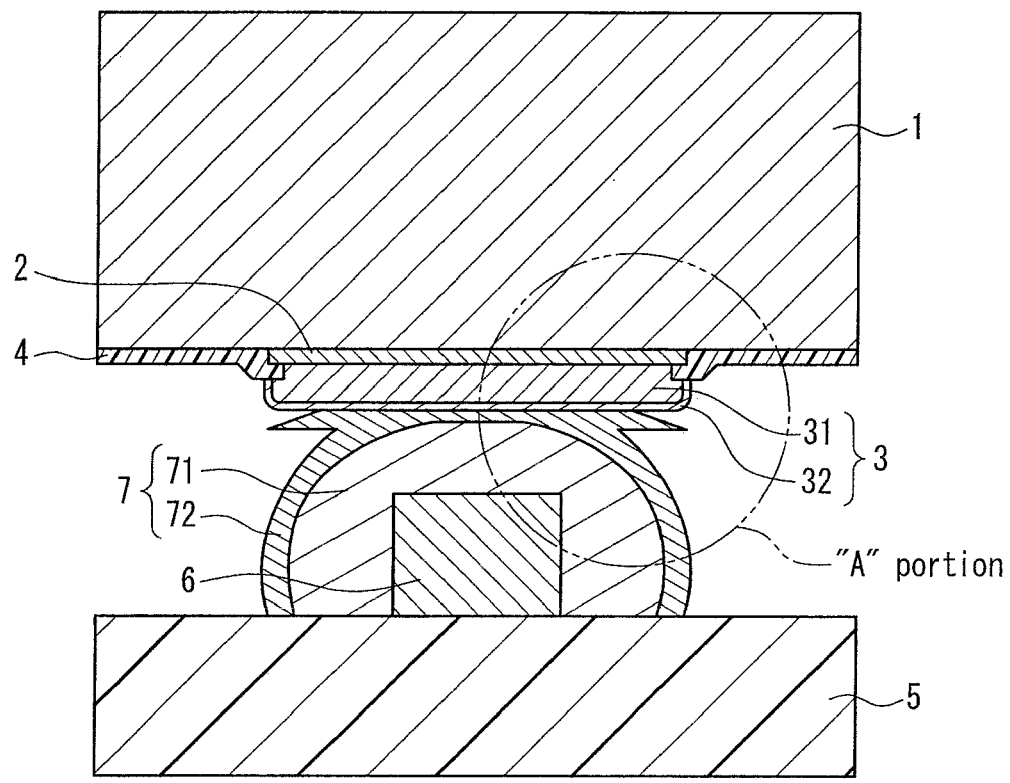
FIG. 2A is a cross-sectional view showing a part of FIG. 1.
Figure 2B:
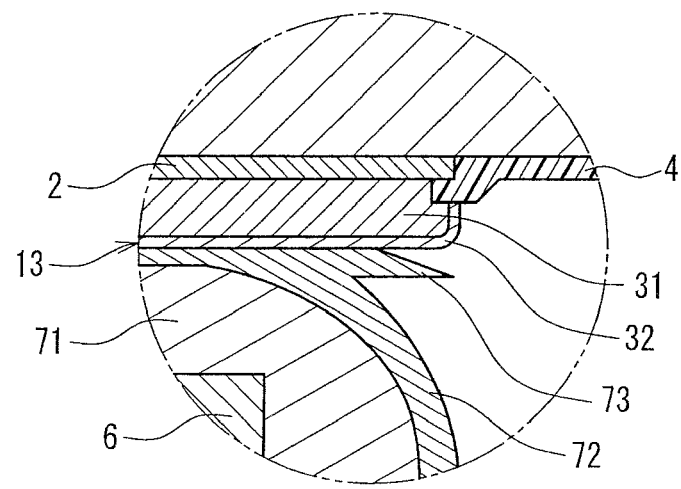
FIG. 2B is an enlarged cross-sectional view showing a part of FIG. 2A.

FIG. 1 is a cross-sectional view showing a semiconductor device according to Embodiment 1 of the present invention. FIG. 2A is a cross-sectional view showing a part of the semiconductor device, that is, an area of the connection via bumps, while FIG. 2B is an enlarged cross-sectional view showing a portion A of the bonding site. These figures show an excellent connection being made.

As shown in FIG. 1, chip bumps 3 are formed on electrodes 2 provided on a semiconductor chip 1. A protective film 4 is formed around the electrodes 2. A tape carrier substrate 9 is composed of an insulating film base material 5, conductive wires 6 provided on the film base material 5, and board bumps 7 formed on the conductive wires 6. The electrodes 2 of the semiconductor chip 1 are connected electrically to the conductive wires 6 of the tape carrier substrate 9 via the bond between the chip bumps 3 and the board bumps 7. The connection area between the circuit side of the semiconductor chip 1 and the tape carrier substrate 9 is provided with a sealing resin 8 that protects and secures the connection.

As shown in FIGS. 2A and 2B, the chip bumps 3 are composed of a Ni base layer 31 and an Au surface layer 32. The board bumps 7 are composed of a Cu base layer 71 and an Au surface layer 72. At a bonding portion 13 between the chip bumps 3 and the board bumps 7 (see FIG. 2B), the thickness of the Au surface layer 72 is shown as having been reduced. That is, part of the Au surface layer 72 of the bonding portion 13 peels off and protrudes outwardly from the bonding portion 13 to form protruding portions 73.

The board bumps 7 are formed so as to have a lower hardness than the chip bumps 3 and to cover the top and both sides of the conductive wires 6 on the film base material 5. The chip bumps 3, at a thickness of 5 μm to 10 μm, are of low height in comparison to common bumps, and are formed flat on the electrodes 2 so as to cover an area above the protective film 4 surrounding the electrodes 2. The board bumps 7 are 15 μm to 30 μm thick, and have a rounded shape in comparison to the chip bumps 3. Thus, in the connected state, the vertex of the rounded board bumps 7 is pushed down by the middle of the flat chip bumps 3, flattening the Cu base layer 71 at the vertex of the board bumps 7, and the Au surface layer 32 of the chip bumps 3 and the Au surface layer 72 of the board bumps 7 form an Au—Au bond.

The material for the chip bumps 3 can be selected from metals that enable film formation through electroless plating. As one example, Ni (nickel) and Au are used to form the bumps by electroless-plating of Ni and Au in this order. The material is not limited to this example. Any combination of metals is possible provided that the metals can be formed as a film through electroless plating. For example, metals such as Pd, Pt and Cu also can be used.

On the other hand, the material for the board bumps 7 has an Au/Cu composition, wherein Au is plated to form the Au surface layer 72 on the surface of the Cu base layer 71 formed through electrolytic plating. A bump composition such as Au/Ni/Cu is also possible. It is favorable that the Vickers hardness of the chip bumps 3 is at least 400 HV, while the Vickers hardness of the board bumps 7 is not greater than 100 HV. The hardness relation between the chip bumps 3 and the board bumps 7 is preferable if the hardness of the chip bumps 3 is at least five-fold of the hardness of the board bumps 7 when measured as Vickers hardness.

The connection mechanism of the chip bumps 3 and the board bumps 7 is described below. When the chip bumps 3 formed on the electrodes 2 of the semiconductor chip 1 and the board bumps 7 formed so as to cover the top and both sides of the conductive wires 6 on the film base material 5 are brought together under pressure and ultrasonic energy is applied, deformation of the softer board bumps 7 occurs. That is, the Au surface layer 72 at the vertex of the rounded board bumps 7 peels off, and the Au surface layer 72 that has peeled off forms the protruding portions 73 of Au plating on the periphery of the bonding portion. Part of the protruding portions 73 of Au plating bonds with the Au surface layer 32 of the chip bumps 3. Further, the Au surface layer 72 at the vertex of the board bumps 7 and the Au surface layer 32 of the chip bumps 3 form the bonding portion 13 composed of a strong Au—Au bond. The thickness of the bonding portion 13 is from ⅓t to ⅛t, which is sufficiently thinner than the original thickness t (0.8 μm to 1.5 μm) of the Au surface layer 72 at the vertex of the board bumps 7. This thickness of ⅓t to ⅛t is, in other words, slightly thicker than the thickness (0.1 μm to 0.5 μm) of the Au surface layer 32 of the chip bumps 3, confirming that a sufficiently strong Au—Au bond is formed by the ultrasonic bonding.

The bonding mechanism is as follows. By pressing the chip bumps 3 into the board bumps 7 while applying load and ultrasonic energy, bonding takes place as impurities at the surface of the Au surface layers 32 and 72 are removed to expose newly formed surfaces, and the excess protruding portions 73 of Au plating bond with the Au surface layer 32 of the chip bumps at the periphery of the bonded chip bumps 3 and board bumps 7.

Stress on the semiconductor chip 1 is alleviated by the vertex of the board bumps 7 deforming during the bonding, since the board bumps 7 have a lower hardness than the chip bumps 3, or rather, the chip bumps 3 have a higher hardness than the board bumps 7, as described above. Moreover, the Au surface layer 72 at the vertex of the rounded board bumps 7 peels off, and the Au surface layer 72 that has peeled off is formed as the protruding portions 73 of Au plating on the periphery of the bonding portion 13. Part of the protruding portions 73 of Au plating forms an Au—Au bond with the Au surface layer 32 of the chip bumps 3, thereby obtaining an excellent bond.

Also, mechanical damage to the semiconductor chip 1 is mitigated since the bonding load is distributed more evenly over the electrodes 2 because the chip bumps 3, being harder than the board bumps 7, are not deformed by the bonding.

Figure 3:
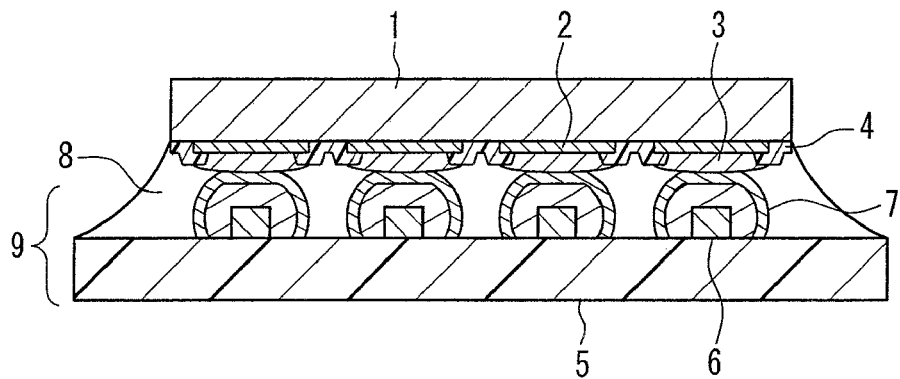
FIG. 3 is a cross-sectional view showing a semiconductor device with a defective connection.
Figure 4:
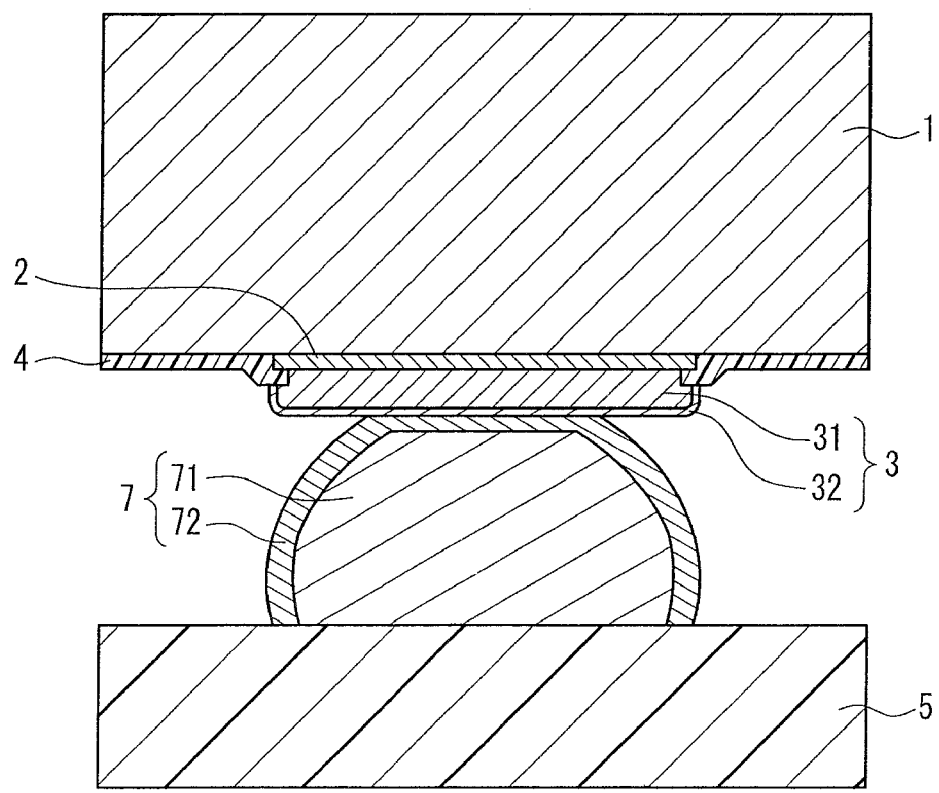
FIG. 4 is a cross-sectional view showing a part of FIG. 3.

To describe more clearly the configuration of the semiconductor device according to the present embodiment and the effects derived therefrom, a cross-sectional view showing an entire semiconductor device with a defective connection (defective product) is shown in FIG. 3 and a cross-sectional view of an enlarged portion of FIG. 3 is shown in FIG. 4.

As shown in FIGS. 3 and 4, the thickness of the Au surface layer 72 of the board bumps 7 at the bonding portion between the chip bumps 3 and the board bumps 7 in the defective product is substantially the same as the thickness in portions other than the bonding portion, despite the vertex of the board bumps 7 being deformed. Also, the Au surface layer 72 at the vertex of the board bumps 7 has not peeled off. In this state, sufficient bonding strength is not obtained, giving rise to the risk of the bond failing due to mechanical stress during handling, such as thermal expansion of the sealing resin 8 or packaging of the semiconductor device.

Figure 5:
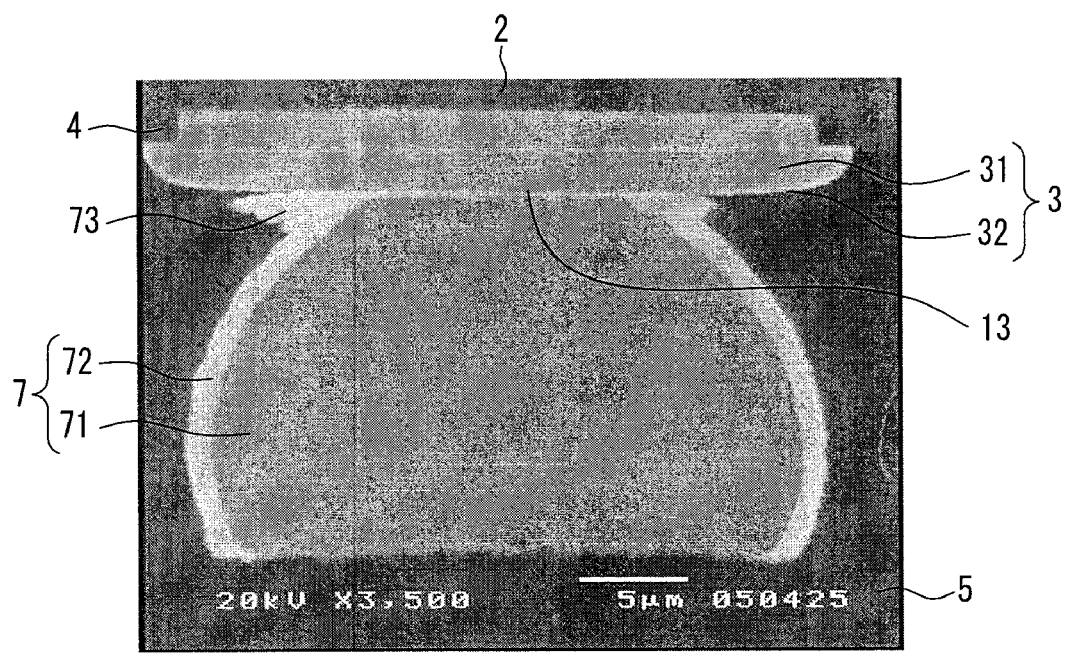
FIG. 5 is a cross-sectional photograph showing the bonding portion of a bump in a semiconductor device with an excellent connection.
Figure 6:
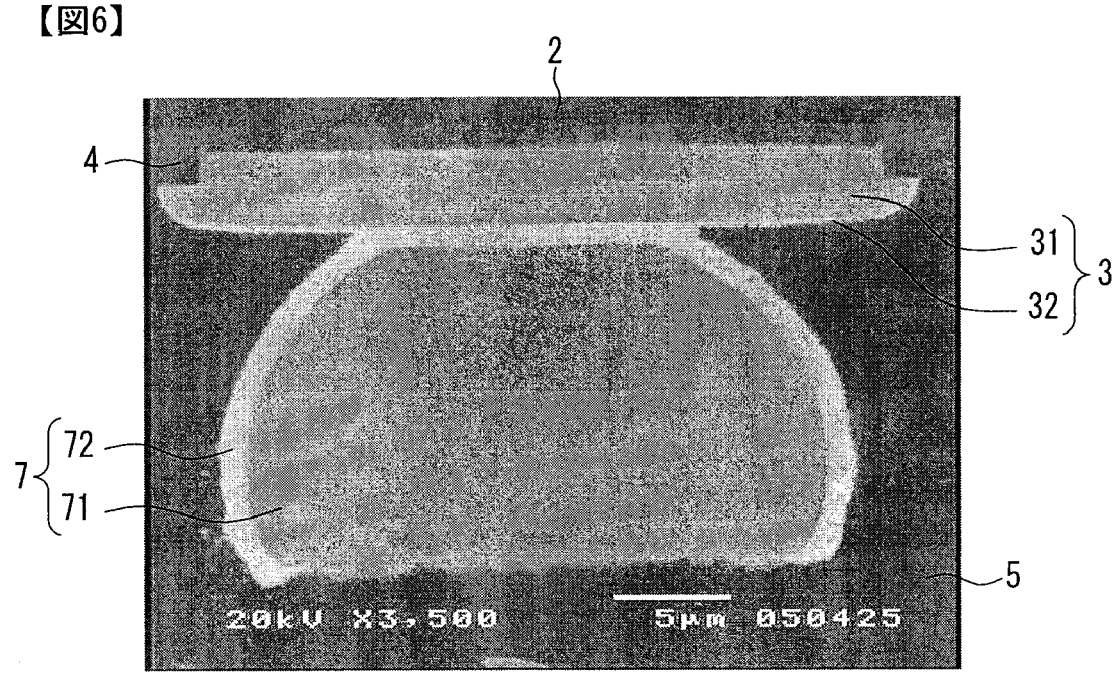
FIG. 6 is a cross-sectional photograph showing the bonding portion of a bump in a semiconductor device with a defective connection.

Photographs of the bonding state of the chip bumps 3 and the board bumps 7 in these non-defective and defective products are shown in FIGS. 5 and 6. FIG. 5 is a cross-sectional photograph of the bonding portion 13 when an excellent connection is made according to the present embodiment, while FIG. 6 is a cross-sectional photograph of the bonding portion 13 when the connection is defective.

The states described with reference to FIGS. 2A and 4 can be observed in the photographs of FIGS. 5 and 6, respectively. In FIG. 5, the protruding portions 73 of Au plating and the thinned Au plating of the bonding portion 13 can be observed. The Au—Au bond of the protruding portions 73 of Au plating with the Au surface layer 32 of the chip bumps 3 also can be observed. In FIG. 6, even looking at the bonding surface of the chip bumps 3 and the board bumps 7, the thickness of the Au surface layer 72 of the board bumps 7 is substantially the same as the thickness in portions other than the bonding portion 13. Also, it can be confirmed that the Au surface layer 72 at the vertex of the board bump 7 has not peeled off.

Figure 7A:
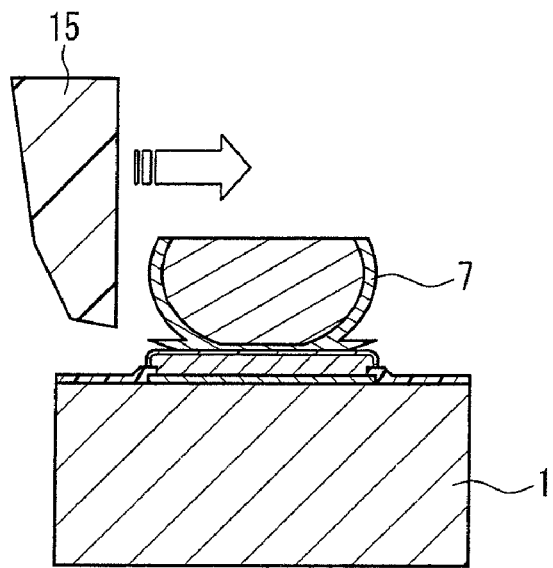
FIG. 7A is a cross-sectional view showing a method for measuring the shear strength of a semiconductor device in which the bonding portion of a bump has an excellent connection or a semiconductor device with a defective connection.
Figure 7B:
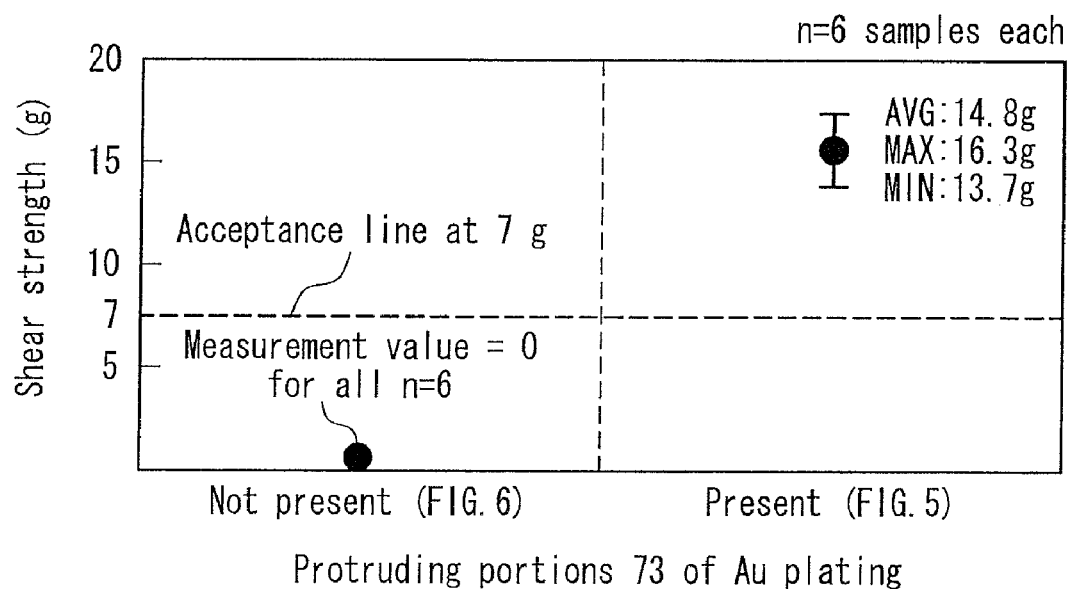
FIG. 7B shows comparative data of the measurement results.

FIGS. 7A and 7B show comparative shear strength measurement data for products with defective and non-defective connections, for semiconductor devices with configurations corresponding to this embodiment of the present invention. The measurement method is shown in FIG. 7A. A shear tool 15 was pushed up against the board bumps 7 at a speed of 0.1 mm/s in the horizontal direction, and the maximum strength was measured until the bumps sheared off. As measurement samples, n=6 each of a semiconductor device with the excellent connection according to the embodiment of the present invention shown in FIG. 5 and a semiconductor device with the defective connection of FIG. 6 were measured.

The measurement results are shown in FIG. 7B. With the connected state shown in FIG. 6, sufficient connection strength was not obtained, and so none of the samples were measurable (0 g) with respect to an acceptance criterion of 7 g shear strength. On the other hand, with the samples according to the embodiment of the present invention shown in FIG. 5, an average of 14.8 g, a maximum of 16.3 g, and a minimum of 13.7 g were the results obtained. From these results, we know that with the connected state (defective product) of FIG. 6, although the bond looks to be secure from the observation photograph, the Au—Au bond between the chip bumps 3 and the board bumps 7 is not secure. On the other hand, with the connected state according to the embodiment of the present invention shown in FIG. 5, bonding can take place as impurities at the surface of the Au surface layers 32 and 72 are removed to expose newly formed surfaces, and part of the protruding portions 73 of Au plating also forms an Au—Au bond, thereby enabling sufficient bonding strength to be secured.

EMBODIMENT 2

The following description relates to a method for manufacturing a semiconductor device according to Embodiment 2 of the present invention.

FIG. 8 show manufacturing processes for a tape carrier substrate with bumps used in the method for manufacturing a semiconductor device according to the present embodiment. FIGS. 8A1 to 8F1 are plan views. FIGS. 8A2 to 8F2 show enlarged cross-sections of the plan views at positions corresponding to the A-A' line in FIG. 8A1.

Firstly, as shown in FIG. 8A1, a terminal portion composed of a plurality of the conductive wires 6 whose tips narrow toward the inside of the film base material 5 is formed on a periphery 4 of the rectangular film base material 5.

Then, as shown in FIG. 8B1, a photoresist 10 is applied at a uniform thickness on the film base material 5, covering the conductive wires 6.

Then, as shown in FIG. 8C1, the photoresist 10 is exposed through an exposure mask 11 in which a long-hole mask pattern 11a is provided.

Then, as shown in FIG. 8D1, the photoresist 10 is developed, forming a long-hole pattern 12. Part of the conductive wires 6 and the film base material 5 are exposed though the open long-hole pattern 12 at regular intervals.

Then, as shown in FIG. 8E1, the conductive wires 6 are plated via the open long-hole pattern 12 to form bumps 7.

Then, as shown in FIG. 8F1, the photoresist 10 is removed, completing the tape carrier substrate 9 with bumps.

Figure 9A:
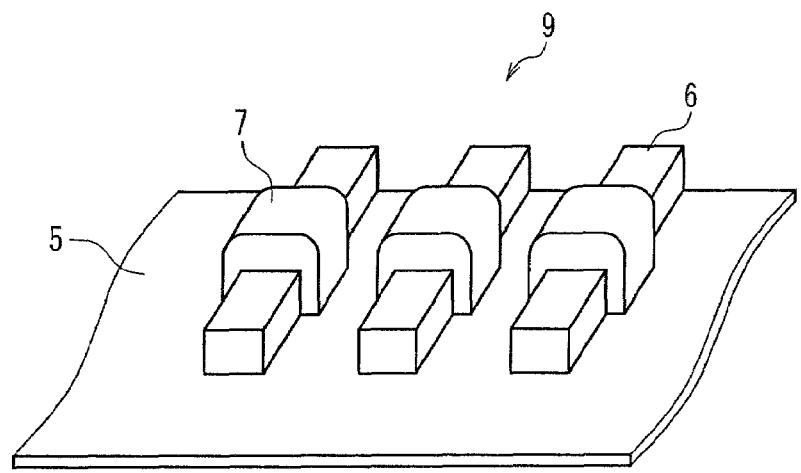
FIG. 9A is a perspective view showing an enlarged bump portion of a tape carrier substrate with bumps used in the method for manufacturing a semiconductor device according to Embodiment 2 of the present invention.
Figure 9B:
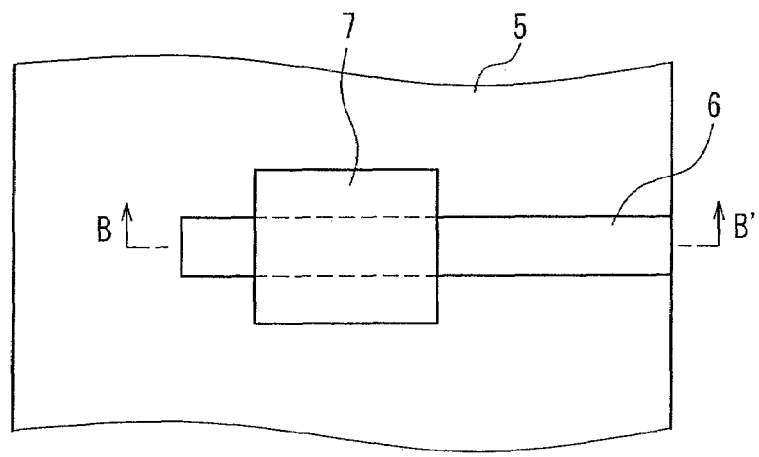
FIG. 9B is a plan view of the same.
Figure 9C:
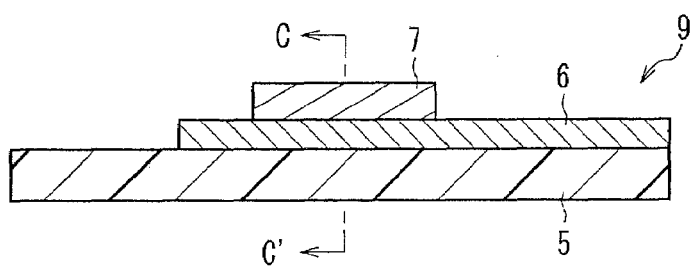
FIG. 9C is a cross-sectional view of FIG. 9B along a line B-B'.
Figure 9D:
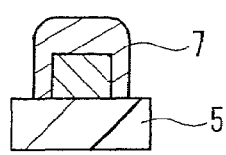
FIG. 9D is a cross-sectional view of FIG. 9C along a line C-C'.

FIGS. 9A, 9B, 9C and 9D are enlarged views of a bump portion of a tape carrier substrate with bumps according to the present embodiment manufactured as described above. FIG. 9A is a perspective view, FIG. 9B is a plan view, FIG. 9C is a cross-sectional view along the B-B' line in FIG. 9B, and FIG. 9D is a cross-sectional view along the C-C' line in FIG. 9C. Bumps 7 are formed so as to cover the top and both sides of the conductive wires 6 on the film base material 5.

A process for mounting a semiconductor chip on a tape carrier substrate manufactured as described above using the method for manufacturing a semiconductor device according to the present embodiment is shown in FIG. 10.

Figure 10A:
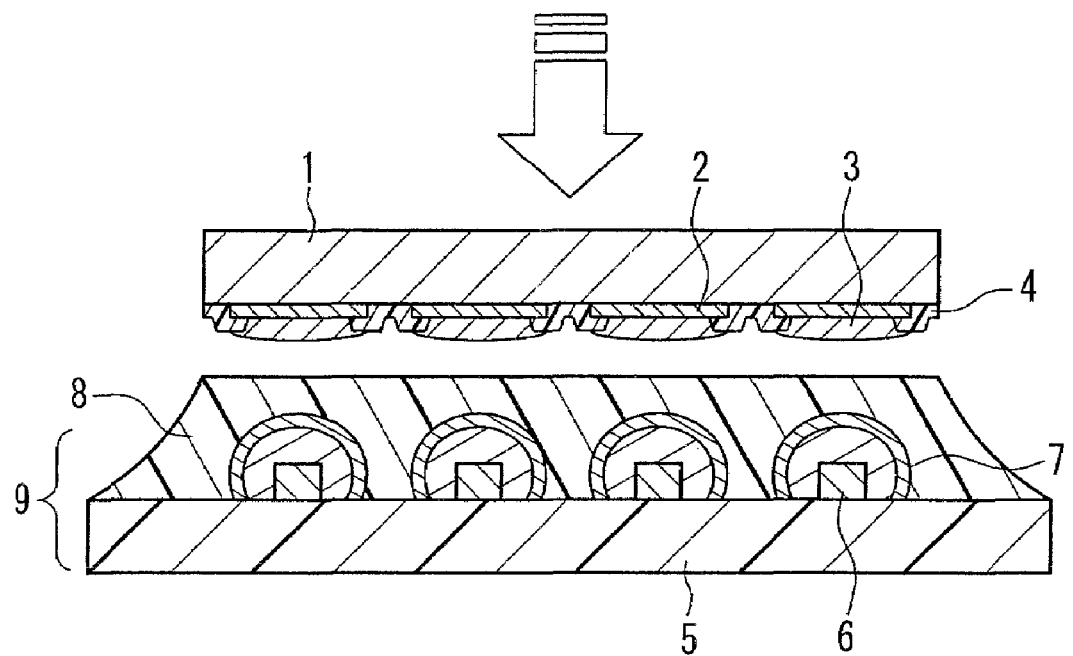
FIGS. 10A and 10B are cross-sectional views showing processes for bonding a semiconductor chip to a tape carrier substrate according to the same manufacturing method.

Firstly, as shown in FIG. 10A, the sealing resin 8 is applied to the tape carrier substrate 9 beforehand, and the chip bumps 3 of the semiconductor chip 1 and the board bumps 7 of the tape carrier substrate 9 are aligned. The alignment at this time generally involves aligning the position of the chip bumps 3 and the board bumps 7 with each other, using an alignment mark on the semiconductor chip 1 and an alignment mark on the film base material 5.

A bonding process is performed next. With the alignment of the chip bumps 3 and the board bumps 7 complete, an increasing bonding load is applied to the semiconductor chip 1 from the underside (topside in the diagram) of the semiconductor chip 1 using a bonding tool (not shown), with respect to the semiconductor chip 1 and the tape carrier substrate 9, to bond the chip bumps 3 and the board bumps 7. This load is set to 0.1 N to 2.0 N per bump. The temperature of the bonding portion is raised at this time from 100° C. to 300° C. An ultrasonic signal is applied to the bonding tool at the same time during this bonding. The application of ultrasonic vibration is performed with an appropriate vibration amplitude in a range of 0.1 μm to 1.0 μm. The bonding of the chip bumps 3 and the board bumps 7 can be performed faster and reliably using the ultrasonic vibrations of the bonding tool produced by the application of the ultrasonic signal. Given that a favorable bond is not obtained when ultrasonic energy is applied once the load is constant, the ultrasonic energy is applied while gradually increasing the load in order to obtain a stable bond.

Figure 10B:
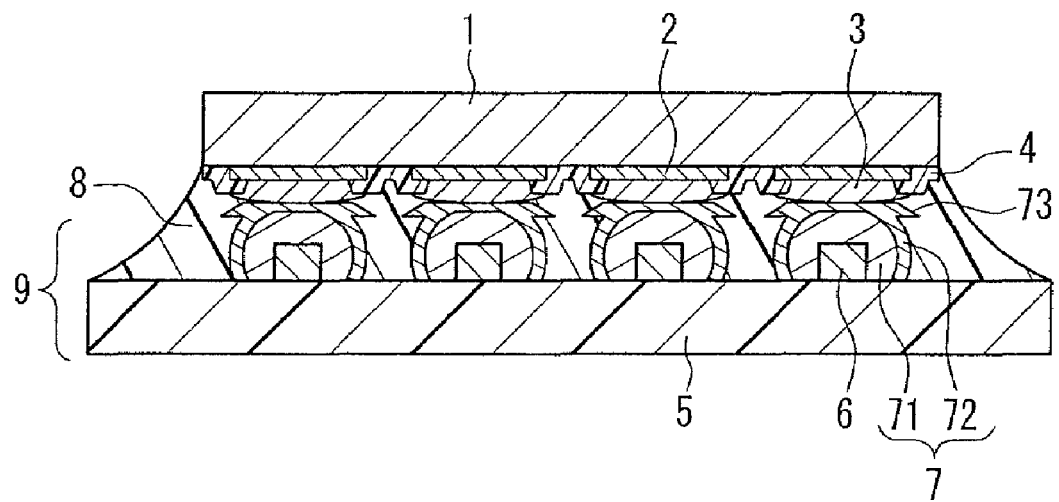
Figure 11:
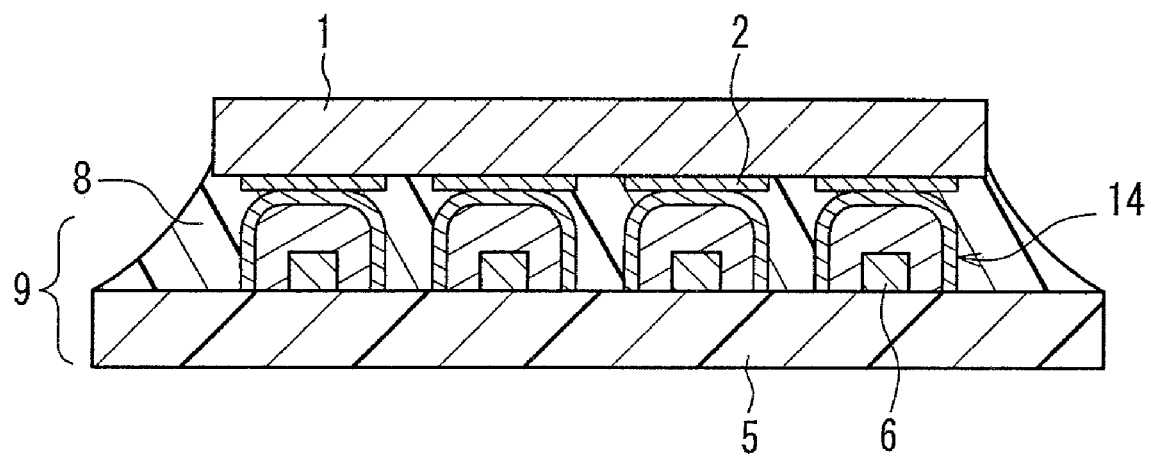
FIG. 11 is a cross-sectional view showing the configuration of a conventional semiconductor device.

FIG. 10B, which is the same as FIG. 1, shows a state in which the bonding of the chip bumps 3 and the board bumps 7 is complete. Because the board bumps 7 have a lower hardness than the chip bumps 3, the vertex of the board bumps 7 is flattened during the bonding as a result of load and ultrasonic waves being applied by the bonding tool. Stress on the semiconductor chip 1 thus is alleviated. Moreover, the Au surface layer 72 at the vertex of the board bumps 7 peels off, and the Au surface layer 72 that has peeled off is formed as the protruding portions 73 of Au plating on the periphery of the bonding portion. Part of the protruding portions 73 of Au plating forms the bonding portion 13 with the Au surface layer 32 of the chip bumps 3, thereby obtaining an excellent bond.

The invention may be embodied in other forms without departing from the gist thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
   a wiring board having a plurality of conductive wires aligned on an insulating base material and a board bump with a plated metal formed on each conductive wire so as to cover an upper surface and both sides of the conductive wire; and
   a semiconductor chip mounted on the wiring board, with electrodes of the semiconductor chip being connected to the conductive wires via the board bumps,
   wherein chip bumps are formed on the electrodes of the semiconductor chip,
   the electrodes of the semiconductor chip are connected to the conductive wires via a bond between the chip bumps and the board bumps,
   a flat area of the chip bumps is larger than an area of the bond with the board bumps,
   the board bumps have a lower hardness than that of the chip bumps, and
   protruding portions are formed by part of the plated metal of the board bumps at the bonded portion peeling off and protruding outwardly from a bonding surface of the chip bumps and the board bumps.

2. The semiconductor device according to claim 1, wherein part of the plated metal of the board bumps that protrudes outwardly from the bonding surface is alloyed with a plated metal of the chip bumps.

3. The semiconductor device according to claim 1, wherein a thickness of the plated metal of the board bumps at the bonding surface is from ⅓ to ⅛ of a thickness of the plating in portions other than the bonding surface.

* * * * *

UNITED STATES PATENT AND TRADEMARK OFFICE
CERTIFICATE OF CORRECTION

PATENT NO. : 7,629,687 B2
APPLICATION NO. : 11/553766
DATED : December 8, 2009
INVENTOR(S) : Kozaka et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 487 days.

Signed and Sealed this

Second Day of November, 2010

David J. Kappos
*Director of the United States Patent and Trademark Office*